United States Patent
Choi et al.

(10) Patent No.: US 6,967,860 B2
(45) Date of Patent: Nov. 22, 2005

(54) FERROELECTRIC MEMORY DEVICE AND CONTROL METHOD THEREOF

(75) Inventors: Mun-Kyu Choi, Gyeonggi-do (KR);
Byung-Jun Min, Gyeonggi-do (KR);
Ki-Nam Kim, Gyeonggi-do (KR);
Byung-Gil Jeon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 107 days.

(21) Appl. No.: 10/683,663

(22) Filed: Oct. 9, 2003

(65) Prior Publication Data
US 2004/0076053 A1    Apr. 22, 2004

(30) Foreign Application Priority Data
Oct. 17, 2002    (KR)    ............... 10-2002-0063443

(51) Int. Cl.[7] ............................................. G11C 11/22
(52) U.S. Cl. ............. 365/145; 365/230.06; 365/189.05
(58) Field of Search .......................... 365/145, 230.06, 365/189.05

(56) References Cited

U.S. PATENT DOCUMENTS

| | | | |
|---|---|---|---|
| 6,385,078 B2 * | 5/2002 | Jeon | 365/145 |
| 6,847,537 B2 * | 1/2005 | Jeon et al. | 365/145 |

* cited by examiner

Primary Examiner—Richard Elms
Assistant Examiner—Tuan T. Nguyen
(74) Attorney, Agent, or Firm—Marger Johnson & McCollom, P.C.

(57) ABSTRACT

A ferroelectric random access memory device including a pulse generator circuit capable of generating a pulse signal in response to an address transition. A chip enable buffer circuit activates a chip enable flag signal in response to a first transition of the pulse signal. A row selector circuit selects and drives one of the rows in response to the address. The row selector circuit also generates a flag signal indicating a selection of a plate line. A control circuit activates a plate control signal in response to the activation of a write enable signal, and deactivates the plate control signal in response to a second transition of the pulse signal. A plate line of a selected row is re-activated according to activation of the plate control signal and is deactivated according to deactivation of the plate control signal.

21 Claims, 6 Drawing Sheets

FERROELECTRIC MEMORY DEVICE AND CONTROL METHOD THEREOF

This application claims priority from Korean Patent Application No. 2002-63443, filed on Oct. 17, 2002, the contents of which are herein incorporated by reference in their entirety.

FIELD OF THE INVENTION

The present invention is a semiconductor memory device, and, in particular, a ferroelectric random access memory device with an address transition detecting function.

BACKGROUND OF THE INVENTION

Non-volatile memory devices maintain data even during power-off by using ferroelectric materials. The ferroelectric materials have hysteresis properties, e.g., PZT. Recent work with ferroelectric-based random access memory devices (FRAM) has shown many advantages over other memory technologies. For example, FRAMs operate at high speeds and low voltages. FRAMs do not require an overly complicated construction and FRAMs allow non-volatile storage. The operational speed of FRAM is typically dependent on the time it takes the ferroelectric material to reverse its polarization. The polarization reverse speed depends on a square measurement of capacitor plates and the thickness of the ferroelectric thin film used to form the FRAM as well as the voltage applied to the device. Experiments have shown that FRAMs are far faster than other non-volatile technologies such as EEPROMs or flash memory devices.

FIG. 1 is a block diagram of a conventional FRAM. Referring to FIG. 1, the FRAM device FIG. comprises a memory cell array 10, a row selector circuit 20, a row address latch circuit 30, a column address latch circuit 40, a column selector circuit 50, a chip enable buffer circuit 60, an input/output control circuit 70, a sense amplifier circuit 80, a data output buffer & write driver circuit 90, an input/output latch circuit 100, and a control circuit 110.

FIG. 2 is a timing diagram associated with a read operation of the FRAM shown in FIG. 1. When an external chip enable signal XCEB transitions from high to low, the chip enable buffer circuit 60 activates a high chip enable flag signal ICE. At this time, the row and column address latch circuits 30 and 40 latch corresponding valid addresses in response to the chip enable flag signal ICE. The row selector circuit 20 activates a word line (e.g., WL0) and a plate line (e.g., PL0) in response to a row address RAi/RAiB (i is, e.g., any integer greater than or equal to 1) latched in the row address latch circuit 30. Activation of the plate line PL0 cause charge sharing between a ferroelectric capacitor and a bit line.

The control circuit 110 activates a sense amplification enable signal SAEN in response to a flag signal PLFLAG indicating that a plate line is selected. This enables the sense amplifier circuit 80 to sense and amplify voltages on each bit line. The data output buffer circuit 90 externally outputs, as read data, the amplified voltages on columns or bit lines. The column selector circuit 50 selects the columns, and the input/output latch circuit 100 externally provides the read data. After the external chip enable signal XCEB is deactivated high, the chip enable flag signal ICE and the activated word line are sequentially deactivated responsive to the sense amplification enable signal SAEN.

FIG. 3 is a timing diagram showing a write operation of the FRAM shown in FIG. 1. Referring to FIG. 3, the write operation is the same as the read operation described above, except that data to be stored in the memory cell array 10 is transferred onto selected bit lines through the input/output latch circuit 110, the write driver circuit 90, and the column selector circuit 50. One disadvantage associated with the conventional FRAM device is that it does not satisfy an asynchronous operating condition of a memory which adopts an address transition detecting manner. Such a memory requires that a write operation is carried out successively after a read/write operation (asynchronous operation). As illustrated in FIGS. 2 and 3, the conventional FRAM device latches an address when an external chip enable signal XCEB is active low, and performs a read/write operation using the latched address. That is, the conventional FRAM device performs a read/write operation in synchronization with a transition of the external chip enable signal XCEB.

Hence, it is not possible to perform a read/write operation while the external chip enable signal XCEB is active low (or before the external chip enable signal XCEB is inactive high).

SUMMARY OF THE INVENTION

It is an object of the present invention to provide a FRAM device that addresses the disadvantages associated with conventional FRAM devices.

It is another object of the present invention to provide a FRAM device capable of asynchronous operation using an address transition detecting manner.

It is yet another object of the present invention to provide a control method of a ferroelectric random access memory device adopting an address transition detecting manner.

A FRAM device according to the present invention operates responsive to an address transition instead of an external chip enable signal XCEB. This is accomplished by inventive reading and writing operations. In particular, the write operation is carried out by activating a write enable signal after activating a plate line according to an address transition. Alternatively, the write operation is carried out by activating a write enable signal and simultaneously activating a plate line. Activation of the write enable signal makes a plate line re-activated in addition to the address transition.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components.

DESCRIPTION OF THE PREFERRED EMBODIMENT

An embodiment of the invention will be more fully described with reference to the attached drawings.

Figure 4:
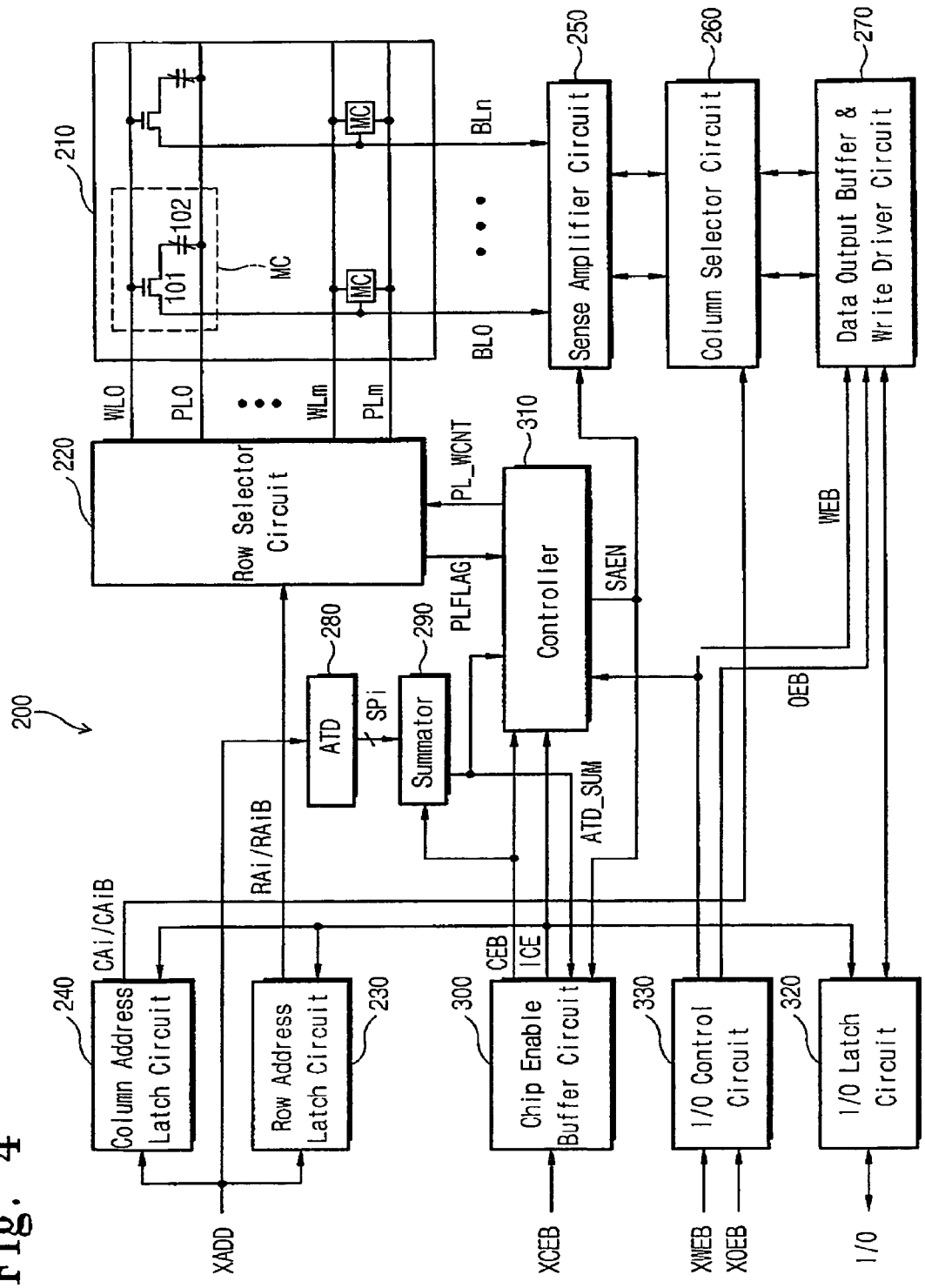
FIG. 4 is a block diagram of the FRAM device according to the present invention.

FIG. 4 is a block diagram of a FRAM device according to the present invention. Referring to FIG. 4, the FRAM device 200 comprises a memory cell array 210 that has a plurality of memory cells MC arranged in plural rows and columns (or bit lines BL0–BLn). Each of the rows comprises a word line and a plate line. For example, a first row comprises a word line WL0 and a plate line PL0. Each memory cell MC comprises a switching or access transistor 101 and a ferroelectric capacitor 102 (that is, each cell storing 1-bit data includes 1 transistor and 1 capacitor, 1T/1C). The switching transistor 101 has a drain connected to one electrode of the ferroelectric capacitor 102. The transistor's source is connected to a corresponding column or bit line. The switching transistor 101 further has a gate connected to a corresponding word line (e.g., WL0). The other electrode of the capacitor 102 is connected to a corresponding plate line (e.g., PL0). Word lines WL0–WLm and plate lines PL0–PLm are connected to a row selector circuit 220.

A row address latch circuit 230 latches a row address in response to a chip enable flag signal ICE. A row address RAi/RAiB latched in the row address latch circuit 230 is transferred to a row selector circuit 220. The row selector circuit 220 selects and drives (or activates) one of rows in the array 210 in response to the row address RAi/RAiB. That is, one word line and one plate are selected according to the row address RAi/RAiB. The row selector circuit 220 activates a selected plate line for a predetermined time. An active time of a plate line is equal to or longer than the minimum time sufficient to secure charge sharing between a ferroelectric capacitor and a bit line. The row selector circuit 220 generates a flag signal PLFLAG indicating a selection of a plate line in response to an input of the row address RAi/RAiB. An active period of the flag signal PLFAG, for example, can be set the same as that of a plate line. The flag signal might be set to other times as necessary to optimize performance.

A column address latch circuit 240 latches a column address in response to the chip enable flag signal ICE. The latched column address CAi/CAiB is transferred to a column selector circuit 260. A sense amplifier circuit 250 senses and amplifies voltages on bit lines BL0–BLn in response to a sense amplification enable signal SAEN. The column selector circuit 260 selects at least one of the bit lines BL0–BLn in response to the column address CAi/CAiB, and connects the selected bit lines to a data output buffer & write driver circuit 270. The data output buffer & write driver circuit 270 operates responsive to signals WEB and OEB. An address transition detector circuit 280 (in the figure, marked "ATD") detects a transition (or variation) of an external address XADD to generate short pulse signals SPi. A summator 290 generates a pulse signal ATD_SUM in response to the short pulse signals SPi. Although the external address does not transition, the summator 290 generates the pulse signal ATD_SUM when a signal CEB transitions. That is, although short pulse signals SPi are not generated, the summator 290 generates the pulse signal ATD_SUM in response to a transition of the CEB signal. Here, the address transition detector circuit 280 and the summator 290 comprise a pulse generator circuit, which generates the pulse signal ATD_SUM in response to an address transition.

In this embodiment, the ATD_SUM signal may have a predetermined pulse width to overcome a limited address skew. It should be apparent to one of reasonable skill in the art that the address transition detector circuit 280 can be realized in the row and column address latch circuits 230 and 240.

A chip enable buffer circuit 300 receives an external chip enable signal XCEB, the pulse signal ATD_SUM and the sense amplification enable signal SAEN and outputs the chip enable flag signal ICE and a buffered chip enable signal CEB. The CEB signal is a buffered version of the XCEB signal. When the external chip enable signal XCEB is active, e.g., at a low level, the chip enable buffer circuit 300 activates the chip enable flag signal ICE in response to deactivation (e.g., a high-low transition) of the pulse signal ATD_SUM. Activation of the chip enable flag signal ICE activates, in turn, circuits 230, 240, 310 and 320. A control circuit 310 is active in response to the CEB signal when the ICE signal is inactive (or the XCEB signal transitions and an external address is not received). This enables a read/write operation to be performed using a previously input address. The chip enable buffer circuit 300 deactivates the chip enable flag signal ICE in response to deactivation of the sense amplification enable signal SAEN.

The control circuit 310 receives the flag signal PLFLAG indicating that a plate line is selected, and activates the signal SAEN after a predetermined time elapses. The predetermined time is set such that charge sharing between a ferroelectric capacitor and a bit line is sufficiently carried out. The control circuit 310 deactivates the signal SAEN in response to activation (e.g., a low-high transition) of the pulse signal ATD_SUM. The control circuit 310 generates a plate control signal PL_WCNT in response to the control signal WEB. The plate control signal PL_WCNT is supplied to the row selector circuit 220. For example, the control circuit 310 activates the plate control signal PL_WCNT in response to activation (e.g., a low-high transition) of the control signal WEB, and the row selector circuit 220 activates a plate line of a selected row in response to activation of the plate control signal PL_WCNT. The control circuit 310 deactivates the plate control signal PL_WCNT in response to a deactivation (e.g., a low-high transition) of the control signal WEB, and the row selector circuit 220 deactivates the activated plate line in response to deactivation of the plate control signal PL_WCNT.

With the present FRAM device, although any plate line is activated at an address transition and is deactivated after a predetermined time, a plate line can be re-activated without a transition of an external address and an external chip enable signal XCEB. This means that the present FRAM device satisfies an asynchronous operating condition that a write operation is carried out continuously after a read operation. More detailed read and write operations will be described below with reference to accompanying drawings.

Figure 5:
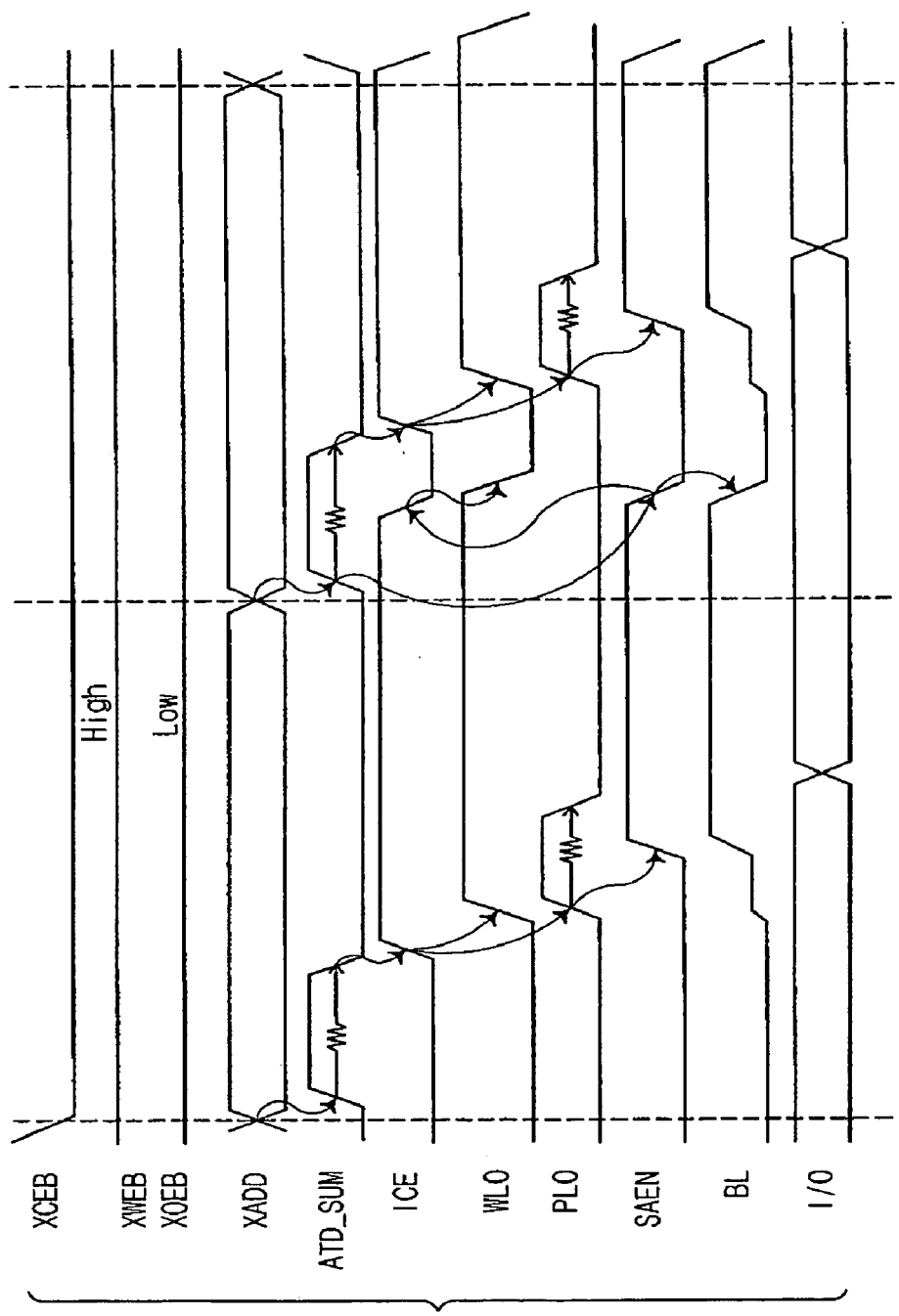
FIG. 5 is a timing diagram of a read operation of the FRAM device shown in FIG. 4.

FIG. 5 is a timing diagram associated with a read operation of the FRAM device shown in FIG. 4. Referring to FIG. 5, an external chip enable signal XCEB transitions from a high level to a low level and then an external address XADD is provided to the FRAM device 200. An address transition detector circuit 280 generates short pulse signals SPi in response to a transition of the external address XADD, and a summator 290 generates a pulse signal ATD_SUM in response to the short pulse signals SPi. A chip enable buffer circuit 300 activates a chip enable flag signal ICE in response to deactivation (e.g., a high-low transition) of the pulse signal ATD_SUM. A row address latch circuit 230, a column address latch circuit 240, a control circuit 310 and an input/output latch circuit 320 operate responsive to activation of the chip enable flag signal ICE.

The row address latch circuit 230 latches a row address in response to activation of the chip enable flag signal ICE, and the latched row address RAi/RAiB is supplied to the row selector circuit 220. The row selector circuit 220 decodes the row address RAi/RAiB and activates a word line (e.g., WL0) and a plate line (e.g., PL0) in a row corresponding to the row address RAi/RAiB. Ferroelectric capacitors 102 of memory cells connected to the selected word lines are connected to corresponding bit lines BL0–BLn, respectively. Voltages on the bit lines BL0–BLn are varied according to data values stored in corresponding ferroelectric capacitors 102, respectively. That is, well-known charge sharing occurs between the capacitors and the bit lines. As shown in FIG. 5, the plate line PL0 activated at an address transition is deactivated after a predetermined time elapses.

The control circuit 310 activates a signal SAEN in response to a flag signal PLFLAG from the row selector circuit 220. A sense amplifier circuit 250 senses and amplifies voltages on the bit lines BL0–BLn in response to activation of the signal SAEN. A column selector circuit 260 selects at least one of the bit lines in response to a column address CAi/CAiB from the column address latch circuit 240, and voltages on the bit lines are transferred to a data output buffer circuit 270. The data output buffer circuit 270 outputs data transferred via the circuit 260 to the outside via an input/output latch circuit in response to an OEB signal from an input/output control circuit 330.

The signals ICE, WL0 and SAEN are sequentially deactivated according to a next address transition. In particular, when an external address XADD transitions again with the external chip enable signal XCEB maintained low, a pulse generator circuit comprising the circuits 280 and 290 generates a pulse signal ATD_SUM. The control circuit 310 deactivates the signal SAEN in response to an low-high transition) of the pulse signal ATD_SUM. The chip enable buffer circuit 300 deactivates the chip enable flag signal ICE in response to deactivation of the signal SAEN. The row and column address latch circuits 230 and 240 are deactivated when the signal ICE becomes inactive. At this time, a selected word line is also deactivated. Likewise, the control circuit 310 and the input/output latch circuit 320 do not operate when the signal ICE becomes inactive. This completes one cycle of a read operation.

It should be apparent to one of reasonable skill in the art that a read operation might be carried out at a deactivation (e.g., a high-low transition) of the pulse signal ATD_SUM, and that this operation is identical to the above-described operation.

Figure 6:
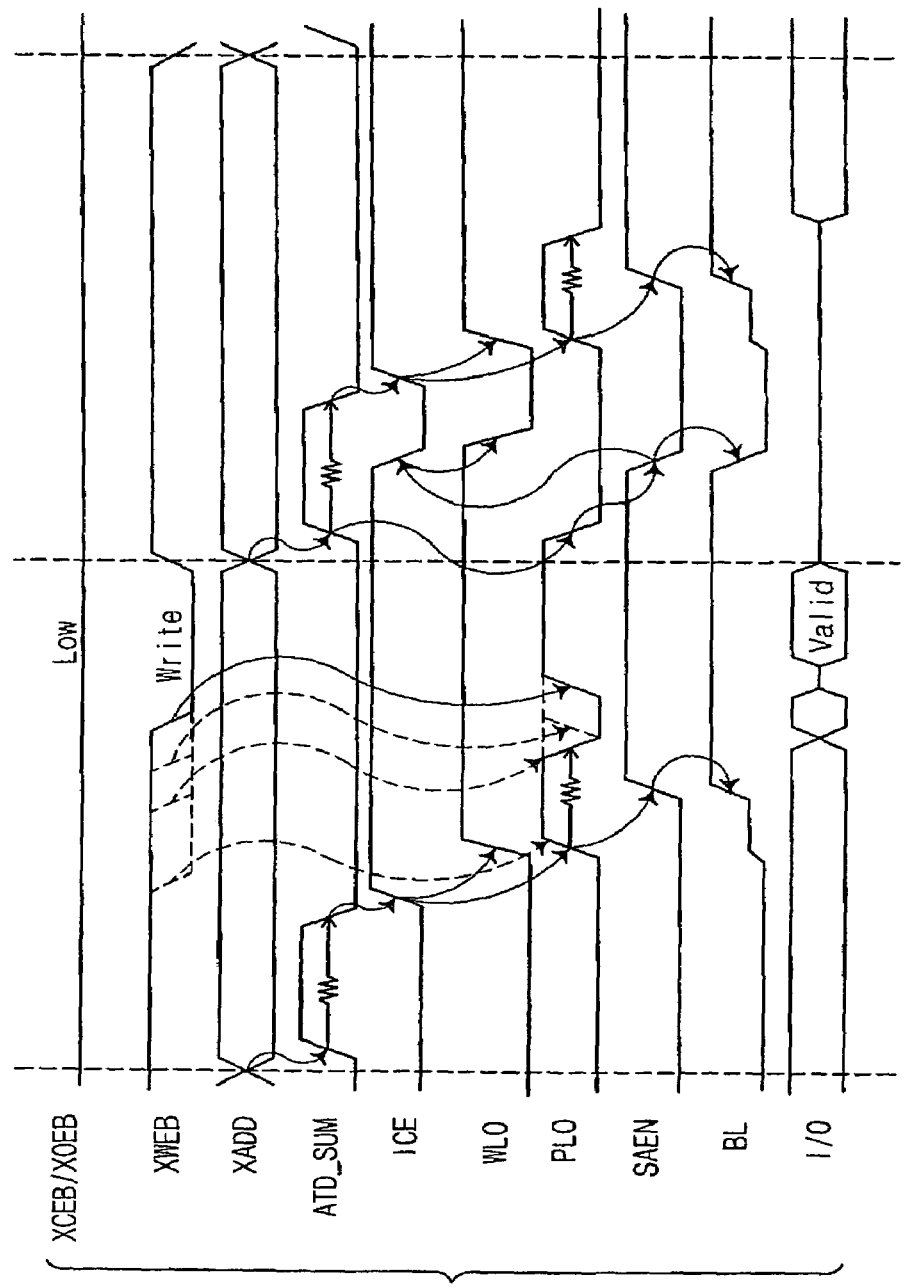
FIG. 6 is a timing diagram of a write operation of the FRAM device shown in FIG. 4.

FIG. 6 is a timing diagram of a write operation associated with the FRAM device shown in FIG. 4. When an external chip enable signal XCEB is maintained low, an external address XADD is provided to the FRAM device 200. An address transition detector circuit 280 generates short pulse signals SPi in response to a transition of the external address XADD, and a summator 290 generates a pulse signal ATD_SUM in response to the short pulse signals SPi. A chip enable buffer circuit 300 activates a chip enable flag signal ICE in response to a deactivation (e.g., a low-high transition) of the pulse signal ATD_SUM. A row address latch circuit 230, a column address latch circuit 240, a control circuit 310 and an input/output latch circuit 320 operate responsive to activation of the chip enable flag signal ICE.

The row address latch circuit 230 latches a row address in response to activation of the chip enable flag signal ICE, and the latched row address RAi/RAiB is supplied to the row selector circuit 220. The row selector circuit 220 decodes the row address RAi/RAiB and activates a word line (e.g., WL0) and a plate line (e.g., PL0) in a row corresponding to the row address RAi/RAiB. Ferroelectric capacitors 102 of memory cells connected to the selected word lines are connected to corresponding bit lines BL0–BLn, respectively. Voltages on the bit lines BL0–BLn are varied according to data values stored in corresponding ferroelectric capacitors 102, respectively. That is, well-known charge sharing occurs between the capacitors and the bit line. As shown in FIG. 6, the plate line PL0 activated at an address transition is deactivated after a predetermined time elapses.

After the plate line PL0 is activated and the predetermined time elapses, the control circuit 310 activates a sense amplification enable signal SAEN in response to a flag signal PLFLAG from the row selector circuit 220. A sense amplifier circuit 250 senses and amplifies voltages on the bit lines BL0–BLn in response to activation of the signal SAEN. A column selector circuit 260 selects at least one of the bit lines in response to a column address CAi/CAiB from the column address latch circuit 240. Afterward, as a write enable signal XWEB transitions from a high level to a low level, valid data to be written in a memory cell array 210 is transferred to selected bit lines through circuits 320, 270, and 260. At the same time, the control circuit 310 activates a plate control signal PL_WCNT based on a transition of a write enable signal XWEB. Activation of the plate control signal PL_WCNT makes a plate line PL0 of a selected row become active. At this time, data '1' is written in a memory cell(s).

As will be understood from the above description, the control circuit 310 controls the row selector circuit 220 so that a plate line is activated at a row address transition and at a transition of the XWEB signal. The write enable signal XWEB can be activated either simultaneously with activation of a plate line according to an address transition, or after activation of a plate line according to an address transition. For example, as illustrated by a dotted line in FIG. 6, the write enable signal XWEB can be activated either simultaneously with deactivation of a plate line, or after deactivation of a plate line.

When an external address XADD transitions again with the signal XCEB maintained low, a pulse generator circuit, comprising the circuits 280 and 290, generates a pulse signal ATD_SUM. The control circuit 310 deactivates the plate control signal PL_WCNT in response to an activation (e.g., a low-high transition) of the pulse signal ATD_SUM, so that the plate line PL0 of the selected row becomes inactive. Since the signal SAEN is activated, data '0' is written in a memory cell(s). Afterward, the signal ICE is deactivated according to deactivation of the signal SAEN. Deactivation of the signal ICE makes the row and column address latch circuits 230 and 240 become inactive. That is, the selected word line WL0 is deactivated. Likewise, the control circuit 310 and the input/output latch circuit 320 do not operate when the signal ICE becomes inactive. This completes one cycle of a write operation.

The present FRAM device can perform a read/write operation using a previously input address. In particular, when an external chip enable signal XCEB transitions from a high level to a low level without a transition of an address, a chip enable buffer circuit 300 buffers and outputs the external chip enable signal XCEB. A summator 290 generates a pulse signal ATD_SUM in response to the buffered signal CEB. Afterward, a read/write operation will be carried out in the same manner as above described, and description thereof is thus omitted.

Figure 1:
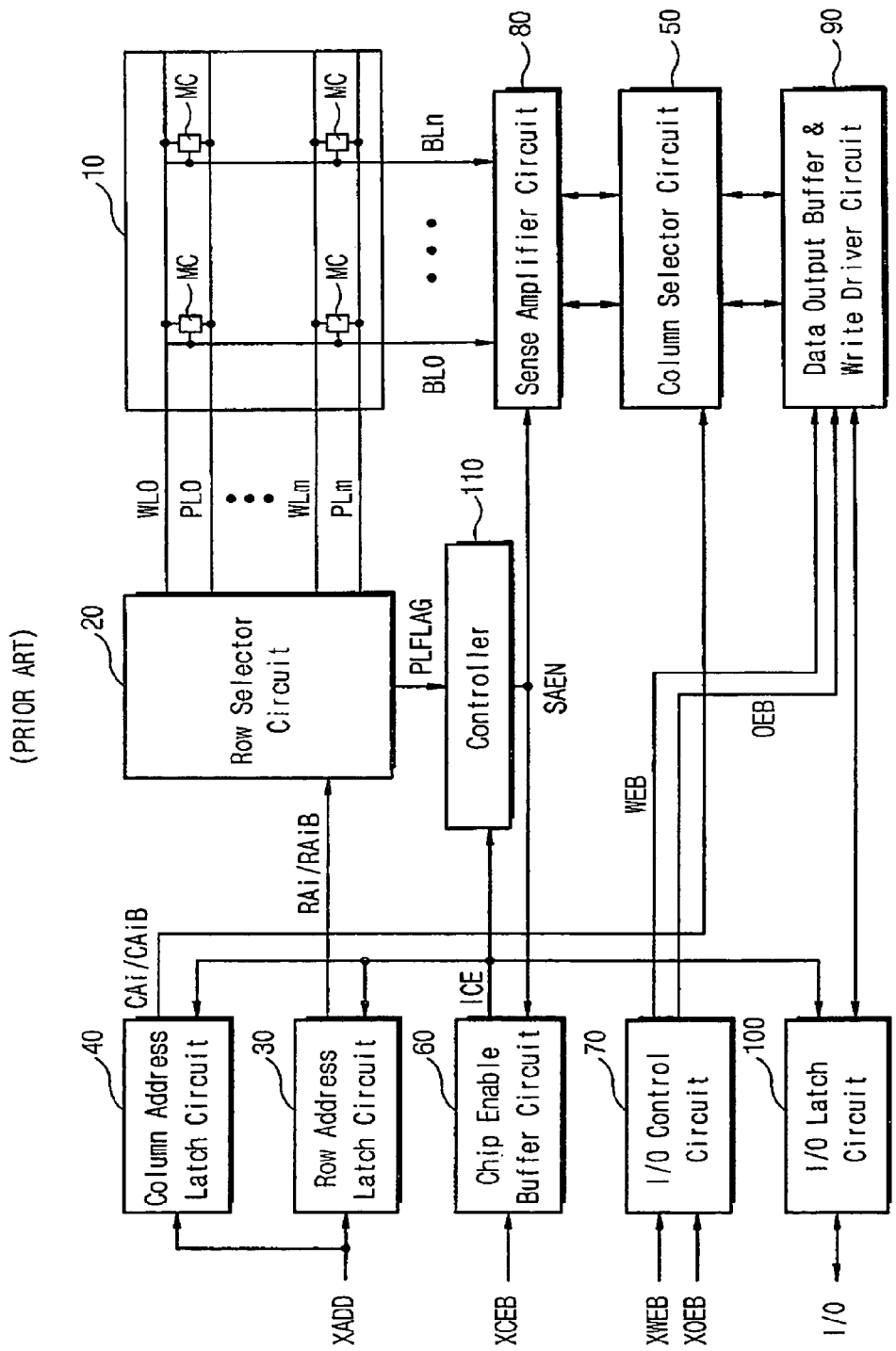
FIG. 1 is a block diagram of a conventional FRAM device.
Figure 2:
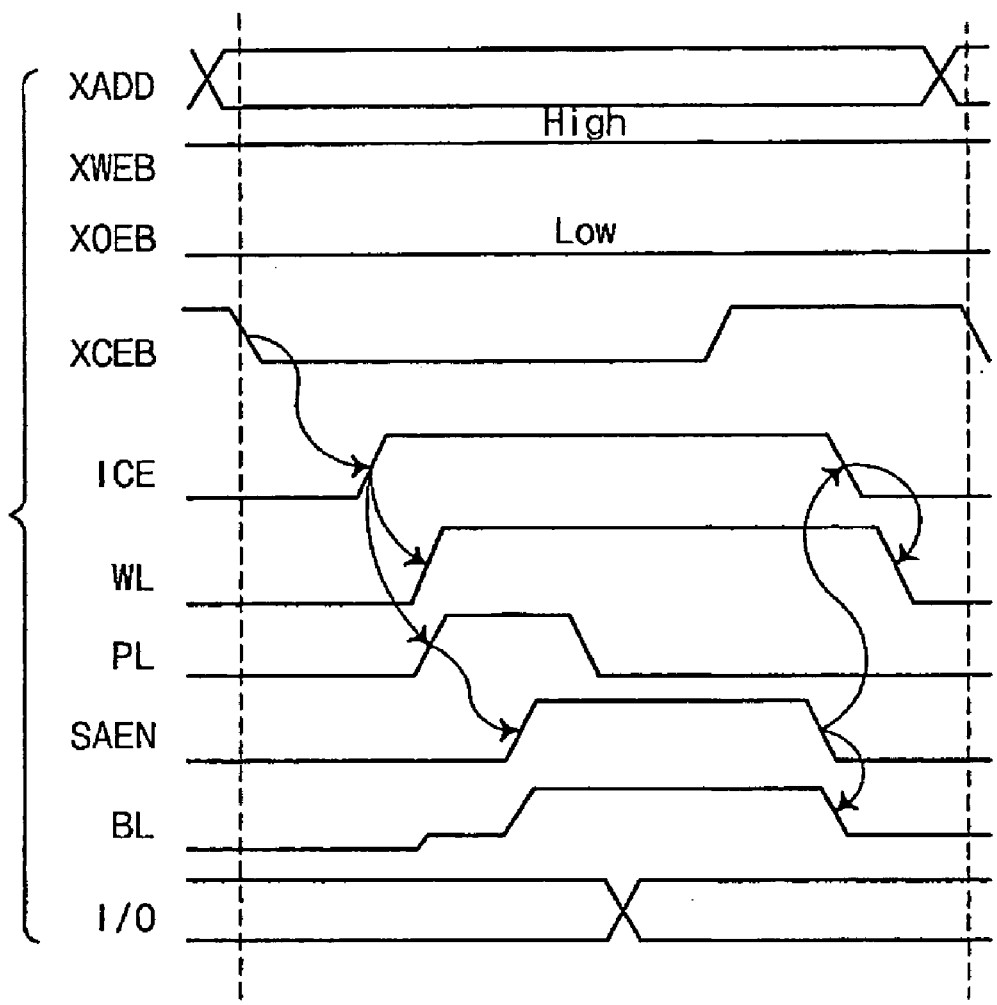
FIG. 2 is a timing diagram of a read operation of the FRAM device shown in FIG. 1.
Figure 3:
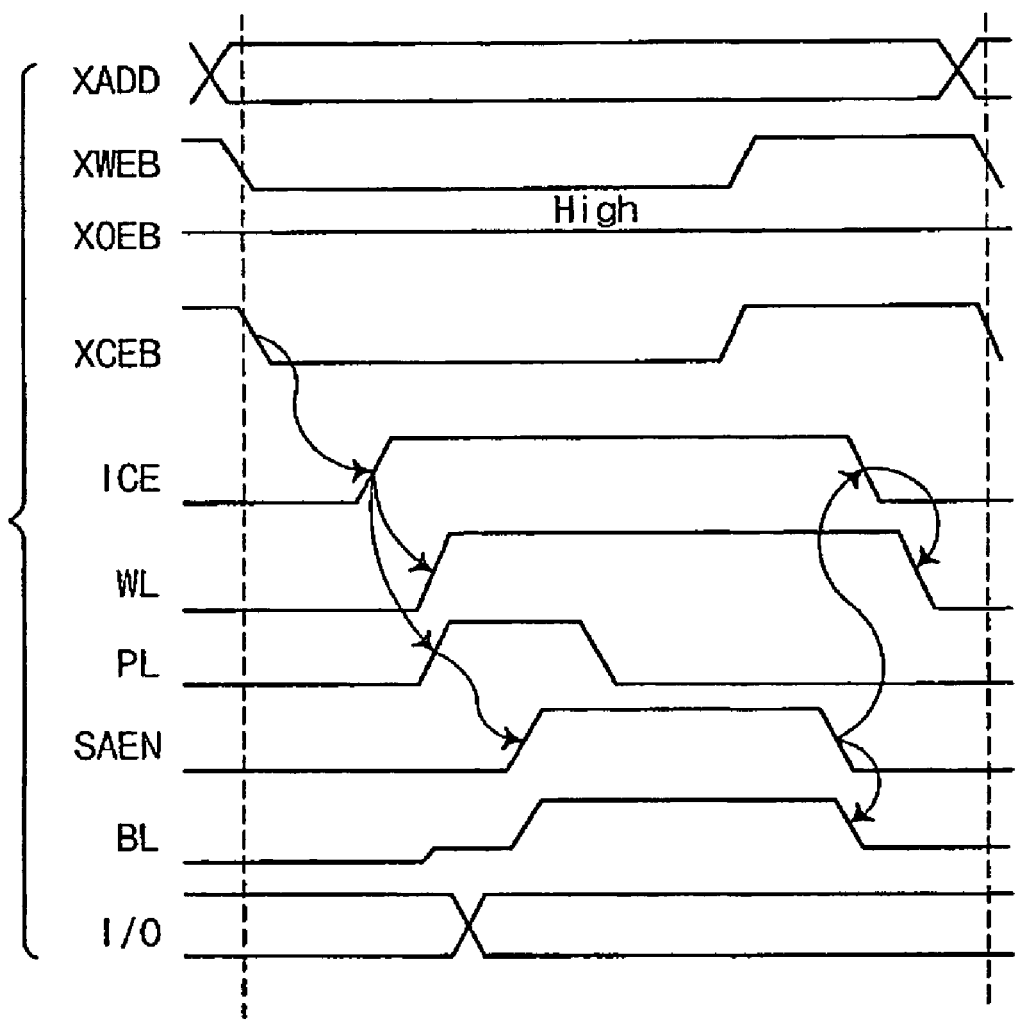
FIG. 3 is a timing diagram of a write operation of the FRAM device shown in FIG. 1.

With the above write timing, the present FRAM device can satisfy an asynchronous operating condition of a memory that operates in synchronization with an address transition. For example, when a read operation is carried out and an external chip enable signal continues to be maintained low, the conventional FRAM device in FIG. 1 does not perform a write operation. The inventive FRAM device, on the other hand, controls a plate line based on an address transition and further on a transition of a write enable signal XWEB. That is, a read operation is carried out based on controlling a plate line according to an address transition. And a write operation is carried out based on controlling a plate line according to a transition of the write enable signal XWEB without a variation of the signal XCEB. Accordingly, it is possible to write data in a memory cell array in response to a transition of the write enable signal XWEB even at a long operating cycle.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A non-volatile semiconductor memory device including a memory cell array of non-volatile memory cells arranged in rows and columns, each row having a word line and a plate line, comprising:
   a pulse generator circuit capable of generating a pulse signal responsive to an address;
   a chip enable buffer circuit capable of activating a chip enable flag signal responsive to the pulse signal;
   a row selector circuit capable of selecting a row responsive to the address and the chip enable flag signal and capable of generating a plate flag signal associated with a plate line of the selected row; and
   a control circuit capable of generating a plate control signal responsive to a write enable signal and the pulse signal;
   where the row selector circuit is capable of activating the plate line responsive to the plate control signal.

2. The memory device of claim 1 comprising a sense amplifier circuit capable of sensing and amplifying data responsive to a sense amplification enable signal.

3. The memory device of claim 2
   where the control circuit is capable of activating the sense amplification enable signal responsive to the plate flag signal; and
   where the control circuit is capable of deactivating the sense amplification enable signal responsive to the pulse signal.

4. The memory device of claim 2
   where the chip enable buffer circuit is capable of deactivating the chip enable flag signal responsive to deactivation of the sense amplification enable signal.

5. The memory device of claim 1
   where a word line of the selected row is deactivated in synchronization with the chip enable flag signal.

6. The memory device of claim 1
   where the plate flag signal is active for a predetermined time; and
   where the plate line is driven during the predetermined time.

7. The memory device of claim 2
   where the activated sense amplification enable signal is deactivated after a plate line is deactivated.

8. A memory device, comprising:
   a memory cell array having non-volatile memory cells arranged in rows and columns, each row comprising at least one word line and one plate line;
   a pulse generator circuit capable of generating a pulse signal responsive to a transition of an address;
   a chip enable buffer circuit capable of buffering an external chip enable signal and activating a chip enable flag signal responsive to a first transition of the pulse signal;
   a row selector circuit capable of selecting a row responsive to the address and capable of generating a flag signal associated with a plate line; and
   a control circuit capable of activating a plate control signal responsive to activation of a write enable signal and deactivating the plate control signal responsive to a second transition of the pulse signal;
   where the row selector circuit is capable of activating a plate line associated with the selected row responsive to the plate control signal; and
   where the pulse generator circuit is capable of generating the pulse signal responsive to the external chip enable signal when the external chip enable signal transitions in the absence of an address transition.

9. The memory device of claim 8 comprising a sense amplifier circuit capable of sensing and amplifying data from the selected row and columns responsive to a sense amplification enable signal.

10. The memory device of claim 9
    where the control circuit is capable of activating the sense amplification enable signal responsive to the flag signal; and
    where the control circuit is capable of deactivating the sense amplification enable signal responsive to the second transition of the pulse signal.

11. The memory device of claim 9
    where the chip enable buffer circuit is capable of deactivating the chip enable flag signal responsive to deactivation of the sense amplification enable signal.

12. The memory device of claim 8
    where a word line of the selected row is deactivated in synchronization with the chip enable flag signal.

13. The memory device of claim 8
    where the flag signal is a pulse signal activated for a predetermined time and a plate line of the selected row is driven during an active period of the pulse signal.

14. The memory device of claim 9
    where the sense amplification enable signal is deactivated after a plate line is deactivated.

15. A non-volatile semiconductor memory device including a plurality of word lines, a plurality of plate lines corresponding to the word lines, a plurality of bit lines, and a plurality of ferroelectric memory cells, comprising:
    a row address latch circuit capable of latching a row address responsive to a chip enable flag signal;
    a column address latch circuit capable of latching a column address responsive to the chip enable flag signal;
    a pulse generator circuit capable of generating a pulse signal responsive to the row and column addresses;
    a chip enable buffer circuit capable of buffering an external chip enable signal and of activating the chip enable flag signal responsive to the pulse signal;
    a row selector circuit capable of selecting a word line and a plate line associated with the selected word line responsive to the address and to the chip enable flag signal and of generating a plate flag signal selecting a plate line; and a sense amplifier circuit capable of sensing and amplifying data from the selected word line responsive to a sense amplification enable signal;

a control circuit capable of activating the sense amplification enable signal responsive to the flag signal and of deactivating the sense amplification enable signal responsive to the pulse signal;

where the control circuit is capable of activating a plate control signal responsive to a write enable signal and of deactivating the plate control signal responsive to the pulse signal; and where the row selector circuit is capable of activating a plate line associated with the selected word line responsive to activation of the plate control signal and of deactivating the plate line associated with the selected word line responsive to deactivation of the plate control signal.

16. The memory device of claim 15 where the pulse generator circuit is capable of generating the pulse signal responsive to the external chip enable signal when the external chip enable signal transitions in the absence of an address transition.

17. The memory device of claim 15 comprising:
a column selector circuit capable of selecting at least one of the bit lines responsive to the column address; and
a data input/output circuit capable of outputting sensed data corresponding to the selected bit lines during a read operation and of transferring write data to the selected bit lines during a write operation.

18. The memory device of claim 15 where the chip enable buffer circuit is capable of deactivating the chip enable flag signal responsive to deactivation of the sense amplification enable signal.

19. The memory device of claim 15 where the selected word line is deactivated in synchronization with the chip enable flag signal.

20. The memory device of claim 15 where the flag signal is a pulse signal activated for a predetermined time; and
where the selected plate line is driven during an activation period of the pulse signal.

21. The memory device of claim 15 where the sense amplification enable signal is deactivated after a plate line is deactivated.

* * * * *

UNITED STATES PATENT AND TRADEMARK OFFICE
CERTIFICATE OF CORRECTION

| | | |
|---|---|---|
| PATENT NO. | : 6,967,860 B2 | Page 1 of 1 |
| APPLICATION NO. | : 10/683663 | |
| DATED | : November 22, 2005 | |
| INVENTOR(S) | : Choi et al. | |

It is certified that error appears in the above-identified patent and that said Letters Patent is hereby corrected as shown below:

TITLE PAGE, ITEM (57) ABSTRACT, please replace "A ferroelectric random access memory device including a pulse generator circuit capable of generating a pulse signal in response to an address transition." with --A ferroelectric random access memory device according to the present invention includes a pulse generator circuit capable of generating a pulse signal in response to an address transition.--

Signed and Sealed this

Sixteenth Day of January, 2007

JON W. DUDAS
*Director of the United States Patent and Trademark Office*